United States Patent
Moghe et al.

(10) Patent No.: US 9,299,655 B2
(45) Date of Patent: Mar. 29, 2016

(54) SINGLE-CHIP INTEGRATED CIRCUIT WITH CAPACITIVE ISOLATION AND METHOD FOR MAKING THE SAME

(75) Inventors: Yashodhan Vijay Moghe, Marsfield (AU); Andrew Terry, Picton (AU); Andrew James Read, West Pennant Hills (AU); Steven Grant Duvall, Manly (AU)

(73) Assignee: THE SILANNA GROUP PTY LTD, Eight Mile Plains, Queensland (AU)

( * ) Notice: Subject to any disclaimer, the term of this patent is extended or adjusted under 35 U.S.C. 154(b) by 17 days.

(21) Appl. No.: 13/988,327

(22) PCT Filed: Nov. 18, 2011

(86) PCT No.: PCT/AU2011/001497
§ 371 (c)(1),
(2), (4) Date: Jun. 25, 2013

(87) PCT Pub. No.: WO2012/065229
PCT Pub. Date: May 24, 2012

(65) Prior Publication Data
US 2014/0145301 A1 May 29, 2014

Related U.S. Application Data

(60) Provisional application No. 61/415,281, filed on Nov. 18, 2010.

(51) Int. Cl.
*H01L 29/00* (2006.01)
*H01L 23/522* (2006.01)
(Continued)

(52) U.S. Cl.
CPC ............ *H01L 23/5222* (2013.01); *H01L 23/48* (2013.01); *H01L 23/5223* (2013.01);
(Continued)

(58) Field of Classification Search
CPC ..... H01L 23/5223; H01L 23/60; H01L 28/40; H01L 23/5383; H01L 23/5222; H01L 23/5225; H01L 23/642; H01L 27/0629; H01L 27/0207; H01L 27/0248; H01L 23/48; H01L 27/0255; H01L 2224/32245; H01L 2224/48247; H01L 2224/49171; H01L 2224/48091; H01L 2224/73265
USPC ............ 257/532, 508, E21.54, 307, 501, 528, 257/535, 619, 620

See application file for complete search history.

(56) References Cited

U.S. PATENT DOCUMENTS

| 4,339,668 | A | 7/1982 | Mueller et al. |
| 6,195,249 | B1 * | 2/2001 | Honda et al. ............... 361/306.3 |

(Continued)

FOREIGN PATENT DOCUMENTS

EP 1388988 B1 8/2011

OTHER PUBLICATIONS

International Search Report for PCT/AU2011/001497 dated Jan. 27, 2012.

(Continued)

*Primary Examiner* — Shouxiang Hu
(74) *Attorney, Agent, or Firm* — Nixon Peabody LLP; Joseph Bach, Esq.

(57) ABSTRACT

An integrated circuit, including at least two integrated circuit portions mutually spaced on a single electrically insulating die and at least one coupling region on the die to provide capacitive coupling between the otherwise mutually isolated integrated circuit portions, the integrated circuit portions being formed by a plurality of layers on the single die, the layers including metal and dielectric layers and at least one semiconductor layer; wherein at least one of the dielectric layers extends from the integrated circuit portions across the coupling region and at least a corresponding one of the metal layers and/or at least one semiconductor layer extends from each of the integrated circuit portions and partially across the coupling region to form capacitors therein and thereby provide the capacitive coupling between the integrated circuit portions.

20 Claims, 16 Drawing Sheets

(51) Int. Cl.
*H01L 23/60* (2006.01)
*H01L 27/06* (2006.01)
*H01L 23/48* (2006.01)
*H01L 27/02* (2006.01)
*H01L 49/02* (2006.01)

(52) U.S. Cl.
CPC ............ *H01L 23/60* (2013.01); *H01L 27/0207* (2013.01); *H01L 27/0248* (2013.01); *H01L 27/0255* (2013.01); *H01L 27/0629* (2013.01); *H01L 28/40* (2013.01); *H01L 2224/32245* (2013.01); *H01L 2224/48091* (2013.01); *H01L 2224/48247* (2013.01); *H01L 2224/49171* (2013.01); *H01L 2224/73265* (2013.01)

(56) References Cited

U.S. PATENT DOCUMENTS

| | | | |
|---|---|---|---|
| 6,430,229 | B1 | 8/2002 | Scott et al. |
| 6,492,716 | B1* | 12/2002 | Bothra et al. .................. 257/678 |
| 6,603,807 | B1* | 8/2003 | Yukutake et al. .............. 375/222 |
| 6,783,065 | B2 | 8/2004 | Spitz et al. |
| 7,064,442 | B1 | 6/2006 | Lane et al. |
| 7,075,329 | B2 | 7/2006 | Chen et al. |
| 7,732,889 | B2 | 6/2010 | Crawley et al. |
| 2006/0061350 | A1 | 3/2006 | Myers et al. |
| 2006/0083056 | A1 | 4/2006 | Daughton et al. |
| 2007/0109842 | A1 | 5/2007 | Daughton et al. |
| 2007/0139986 | A1 | 6/2007 | Lange |
| 2008/0017971 | A1 | 1/2008 | Hollis |
| 2008/0277761 | A1 | 11/2008 | Mahalingam et al. |
| 2009/0017773 | A1 | 1/2009 | Dupuis et al. |
| 2009/0160029 | A1 | 6/2009 | Pitts et al. |
| 2009/0243028 | A1 | 10/2009 | Dong et al. |
| 2009/0251131 | A1 | 10/2009 | Myers et al. |
| 2010/0193907 | A1 | 8/2010 | Crawley et al. |
| 2011/0199073 | A1 | 8/2011 | Myers et al. |

OTHER PUBLICATIONS

C. Rooman, et al. "Asynchronous 250-Mb/s Optical Receivers with Integrated Detector in Standard CMOS Technology for Optocoupler Applications," IEEE Journal of Solid-State Circuits, vol. 35, No. 7, pp. 953-958, Jul. 2000.
E. Culurciello, et al. "Monolithic digital galvanic isolation buffer fabricated in silicon on sapphire CMOS," Electronics Letters, vol. 41, No. 9, pp. 526-528, Apr. 2005.
N. Akiyama, et al. "A High-Voltage Monolithic Isolator for a Communication Network Interface," IEEE Transactions of Electron Devices, vol. 49, No. 5, pp. 895-901, May 2002.
S. Kaeriyama, et al. "A 2.5kV isolation 35kV/us CMR 250Mbps 0.13mA/Mbps Digital Isolator in Standard CMOS with an on-chip small transformer," IEEE Symposium on VLSI Circuits, pp. 197-198, 2010.
S. Park, et al. "Modeling of giant magnetoresistance isolator for high speed digital data transmission utilizing spin valves," Journal of Applied Physics, vol. 97, pp. 10E106-1-10E106-3, May 2005.
Y. Moghe, et al. "Monolithic 2.5 kV RMS, 1.8 V-3.3 V Dual-Channel 640Mbps Digital Isolator in 0.5μm SOS," SOI Conference (SOI), 2012 IEEE International.
ADuM3440/ADuM3441/ADuM3442 Quad Channel, High Speed Digital Isolators Data Sheet by Ananlog Devices, 2007-2012.
IL710 High Speed Digital Isolators Data Sheet by NVE Corporation.
ISO7240CF, ISO7240C, ISO7240M, ISO7241C, ISO7241M, ISO7242C, ISO7242M High Speed Quad Digital Isolators Data Sheet by Texas Instruments, 2007-2012.
Si8410/20/21 Low-Power Single and Dual-Channel Digital Isolators Data Sheet by Silicon Laboratories, 2011.
Si8460/61/62/63 Low Power Six-Channel Digital Isolator Data Sheet by Silicon Laboratories, 2011.

* cited by examiner

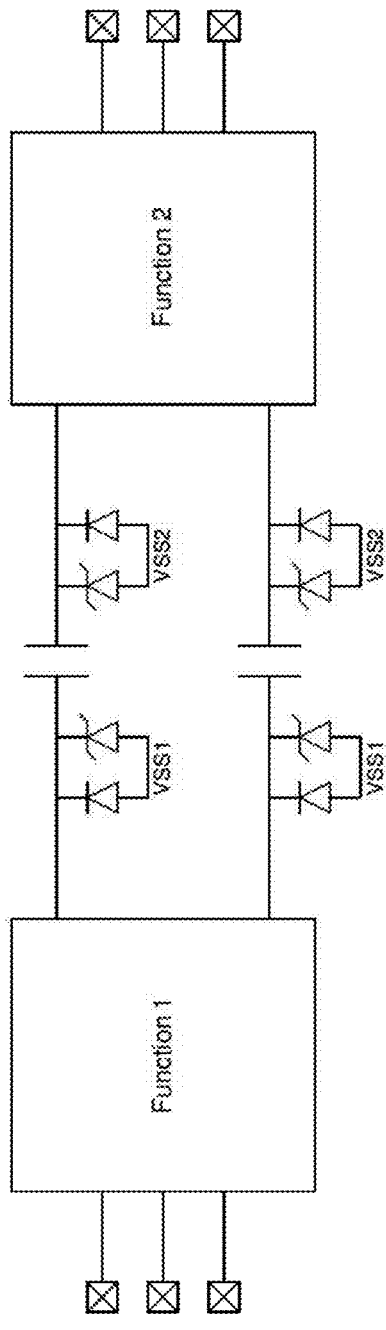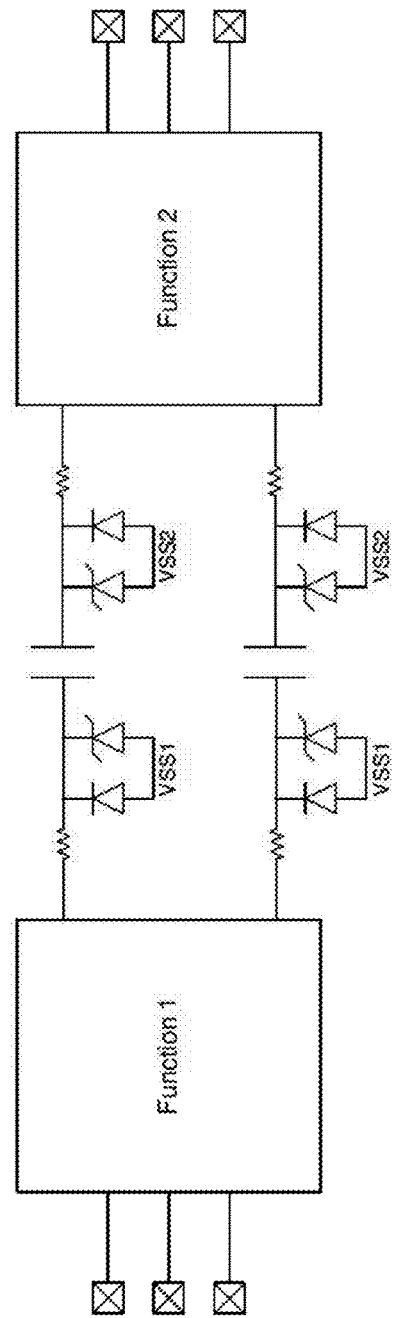
Figure 8A
Figure 8B

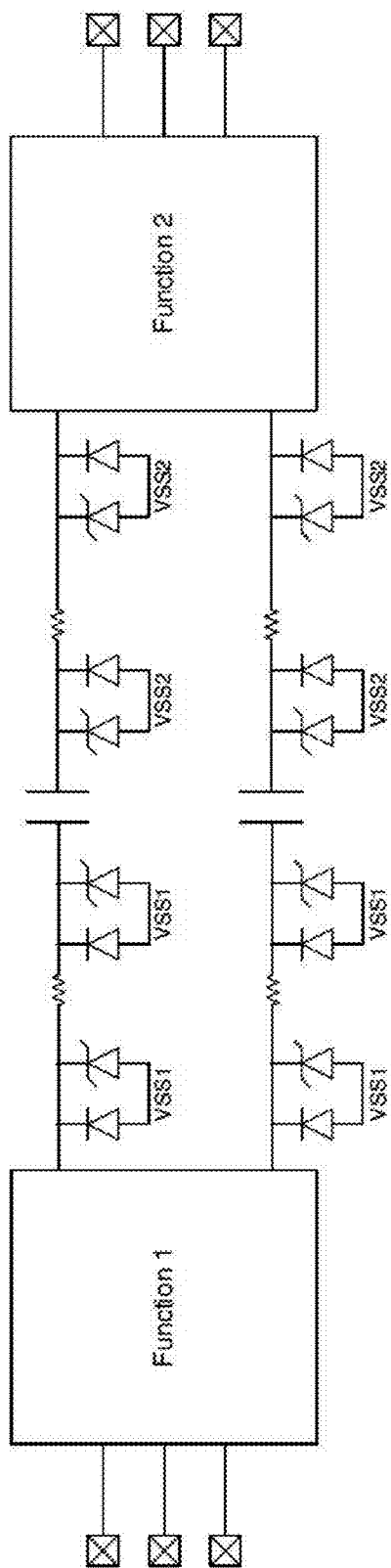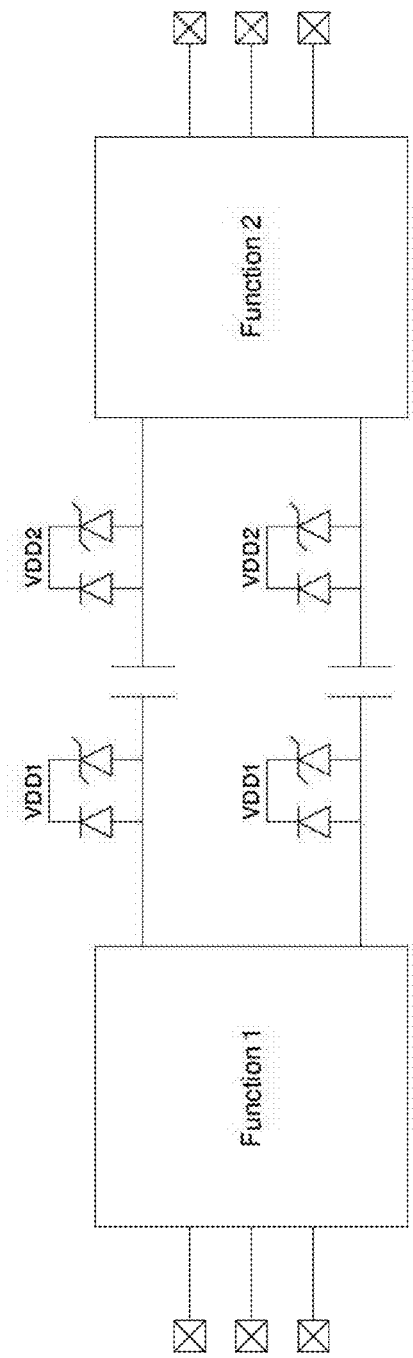
Figure 8C
Figure 9

SINGLE-CHIP INTEGRATED CIRCUIT WITH CAPACITIVE ISOLATION AND METHOD FOR MAKING THE SAME

RELATED APPLICATIONS

This application is a National Phase of International Application No. PCT/AU2011/001497, entitled "SINGLE-CHIP INTEGRATED CIRCUIT WITH CAPACITIVE ISOLATION", which was filed on Nov. 18, 2011, and which claims priority of U.S. Application No. 61/415,281, filed on Nov. 18, 2010, and the disclosures of which are hereby incorporated by reference herein in their entirety.

TECHNICAL FIELD

The present invention relates to an integrated circuit, and in particular to a single-chip or single-die integrated circuit with capacitive isolation and a method of producing an integrated circuit.

BACKGROUND

The transmission of signals across an electrical isolation barrier is important for many applications, including the following:
  Mains connected medical equipment (for patient safety)
  Communications links across cables between mains connected equipment (to avoid ground loops). Examples are USB, Firewire, Ethernet etc.
  Isolating telecommunications equipment from phone lines (for lightning strike protection)
  Mains data networks (for mains power isolation)
  Precision audio, sensing and data acquisition (to suppress noise pickup)
  Industrial sensing and control (for isolation of various power domains)
  Automotive circuits (for protection from high voltage electrical spikes)

Traditionally, such communication has been achieved by using optocouplers to send and receive optical signals across the electrical isolation barrier. However, optocouplers can support only relatively low data rates (~10 Mbps), and consume a lot of power (>10 mW). In view of such shortcomings, electronics manufacturers are increasingly introducing other forms of digital isolators based on a variety of technologies, including inductive (transformer), capacitive, and Giant MagnetoResistance (GMR) coupling.

However, these technologies are currently limited to data rates of ~150 Mbps. As new high speed signalling standards have emerged (including USB 2 480 Mbps, USB 3, Firewire, and gigabit Ethernet), there has been to date no way of isolating them easily and efficiently.

It is desired to provide an integrated circuit and a method of producing an integrated circuit that alleviate one or more difficulties of the prior art, or that at least provide a useful alternative.

SUMMARY

In accordance with some embodiments of the present invention, there is provided an integrated circuit, including:
  at least two integrated circuit portions mutually spaced on a single electrically insulating die and at least one coupling region on the die to provide capacitive coupling between the otherwise mutually isolated integrated circuit portions;
  the integrated circuit portions being formed by a plurality of layers on the single die, the layers including metal and dielectric layers and at least one semiconductor layer;
  wherein at least one of the dielectric layers extends from the integrated circuit portions across the coupling region and at least a corresponding one of the metal layers and/or at least one semiconductor layer extends from each of the integrated circuit portions and partially across the coupling region to form capacitors therein and thereby provide the capacitive coupling between the integrated circuit portions.

Some embodiments of the present invention also provide an integrated circuit, including:
  at least two integrated circuit portions mutually spaced on a single electrically insulating die and at least one coupling region on the die to provide capacitive coupling between the otherwise mutually isolated integrated circuit portions;
  the integrated circuit portions being formed by a plurality of layers on the single die, the layers including metal and dielectric layers and at least one semiconductor layer;
  wherein at least one of the dielectric layers extends from the integrated circuit portions across the coupling region and at least a corresponding one of the metal layers and/or at least one semiconductor layer extends from each of the integrated circuit portions and partially across the coupling region to form capacitors therein and thereby provide the capacitive coupling between the integrated circuit portions; and
  wherein the integrated circuit includes a discontinuous die seal around the integrated circuit portions, the discontinuous die seal being in the form of mutually spaced die seal portions separated by gaps disposed at locations corresponding to the at least one coupling region.

Some embodiments of the present invention also provide an integrated circuit, including:
  at least two integrated circuit portions mutually spaced on a single electrically insulating die and at least one coupling region on the die to provide capacitive coupling between the otherwise mutually isolated integrated circuit portions;
  the integrated circuit portions being formed by a plurality of layers on the single die, the layers including metal and dielectric layers and at least one semiconductor layer;
  wherein at least one of the dielectric layers extends from the integrated circuit portions across the coupling region and at least a corresponding one of the metal layers and/or at least one semiconductor layer extends from each of the integrated circuit portions and partially across the coupling region to form capacitors therein and thereby provide the capacitive coupling between the integrated circuit portions;
  wherein each of said integrated circuit portions is capacitively coupled to a corresponding other of said integrated circuit portions via a corresponding pair of said capacitors, each said capacitor being connected to each said integrated circuit portion by a corresponding conductor; and
  wherein one or more corresponding electro-static discharge (ESD) components are connected between the corresponding conductor and one or more sinks for electrostatic discharge.

Some embodiments of the present invention also provide a method of producing an integrated circuit, including:
  forming a plurality of layers on a single electrically insulating substrate, the layers including metal and dielectric layers and at least one semiconductor layer;

patterning at least some of the layers to form at least two integrated circuit portions mutually spaced on the substrate and at least one coupling region to provide capacitive coupling between the otherwise mutually isolated integrated circuit portions;

wherein at least one of the dielectric layers extends from the integrated circuit portions across the coupling region and at least a corresponding one of the metal layers and/or at least one semiconductor layer extends from each of the integrated circuit portions and partially across the coupling region to form capacitors therein and thereby provide the capacitive coupling between the integrated circuit portions.

BRIEF DESCRIPTION OF THE DRAWINGS

Some embodiments of the present invention are hereinafter described, by way of example only, with reference to the accompanying drawings, wherein:

FIGS. 7A, 7B, 7C, 8A, 8B, 8C and 9 are schematic diagrams illustrating respective circuit configurations for providing ESD protection to the functional components of an isolator or chip or die in accordance with embodiments of the present invention;

DETAILED DESCRIPTION

Embodiments of the present invention relate to single-chip, single-die or single-substrate integrated circuits having capacitive isolation, and in particular to high speed, high-voltage (up to several kV), capacitive isolators on single dielectrically insulated dies, and devices based on such isolators. Forming isolators on a single die rather than on a multi-die assembly results in lower manufacturing costs and reduced operational power consumption.

Figure 1:
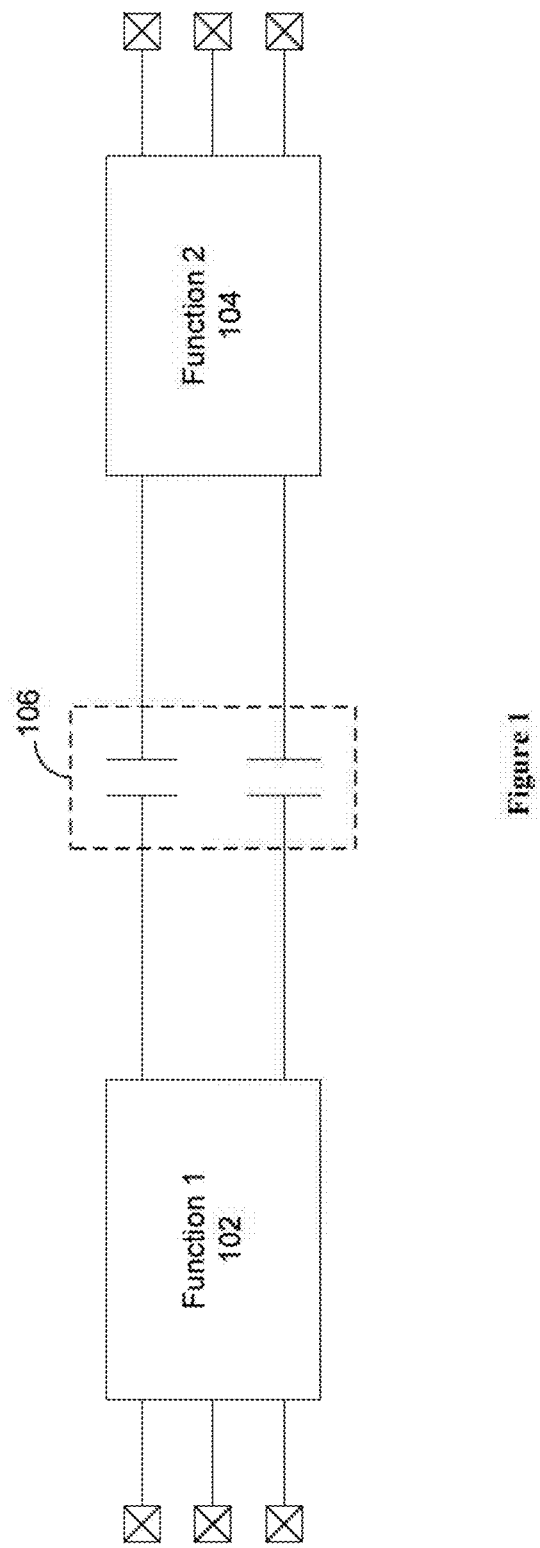
FIG. 1 is a schematic diagram illustrating the fundamental components of a single-die, high-voltage isolator.

The basic concept of the capacitive isolator is illustrated in FIG. 1. It consists of one function or circuit block 102 communicating with another function or circuit block 104 via at least two capacitive connections 106, this being the minimum number that allows a complete electrical circuit to be formed. The capacitors 106 provide galvanic isolation between the functional components 102, 104 whilst allowing useful signals to pass between them by way of capacitive coupling.

The type of communication across the interface can include one or more of the following:
(i) Uni or bi-directional AC or DC power (the latter via rectification of an AC signal);
(ii) Uni or bi-directional analog communication; and
(iii) Uni or bi-directional digital communication.

The isolator configurations described herein can support all of these communication types and also provide some unique advantages over the prior art, including much higher speed digital communications. Current state-of-the-art isolators provide data speeds up to ~150 Mbps per channel, whereas the digital isolators on SOS (silicon-on-sapphire) substrates described herein have been measured to provide data speeds in excess of 1 Gbps.

Capacitor Configurations

Figure 2:
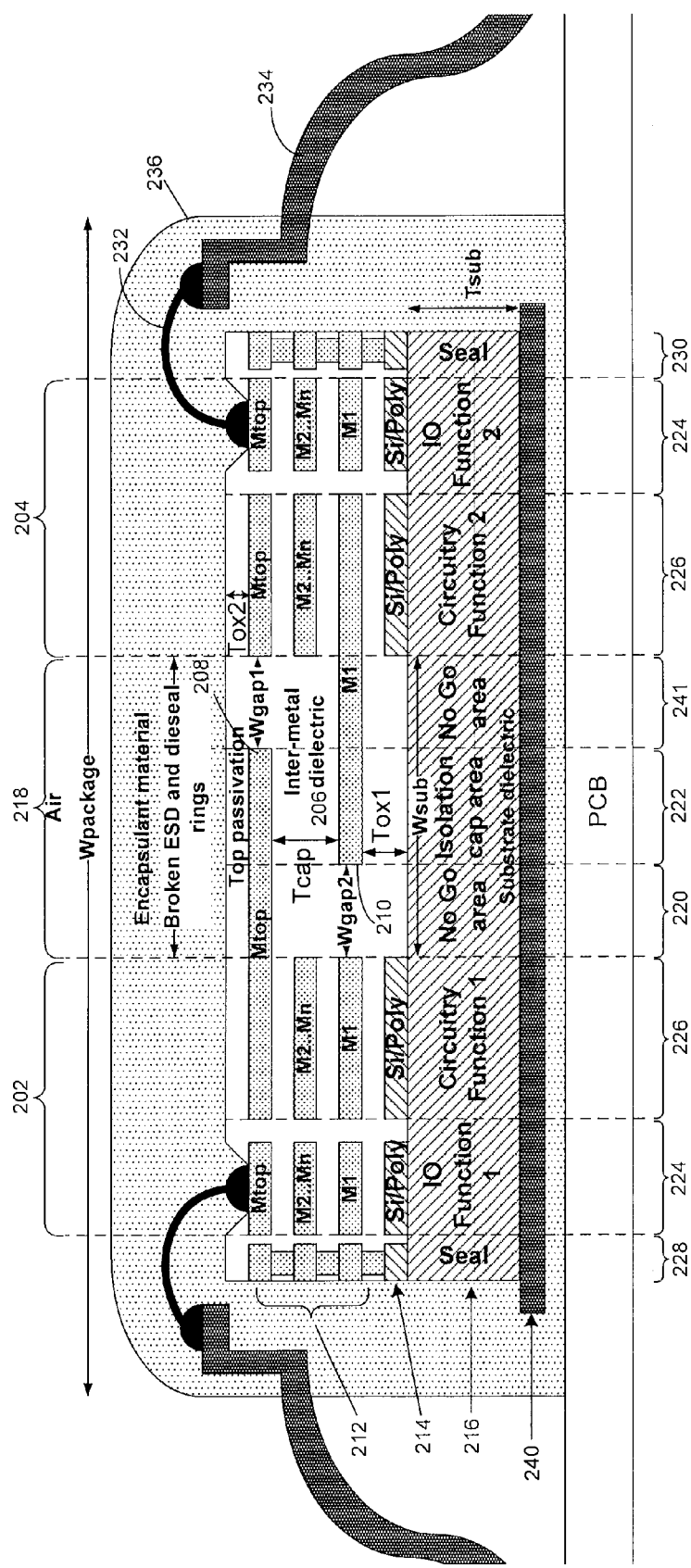
FIG. 2 is a schematic cross-sectional side view of an embodiment of an isolator having a vertical gap coupling capacitor.
Figure 3:
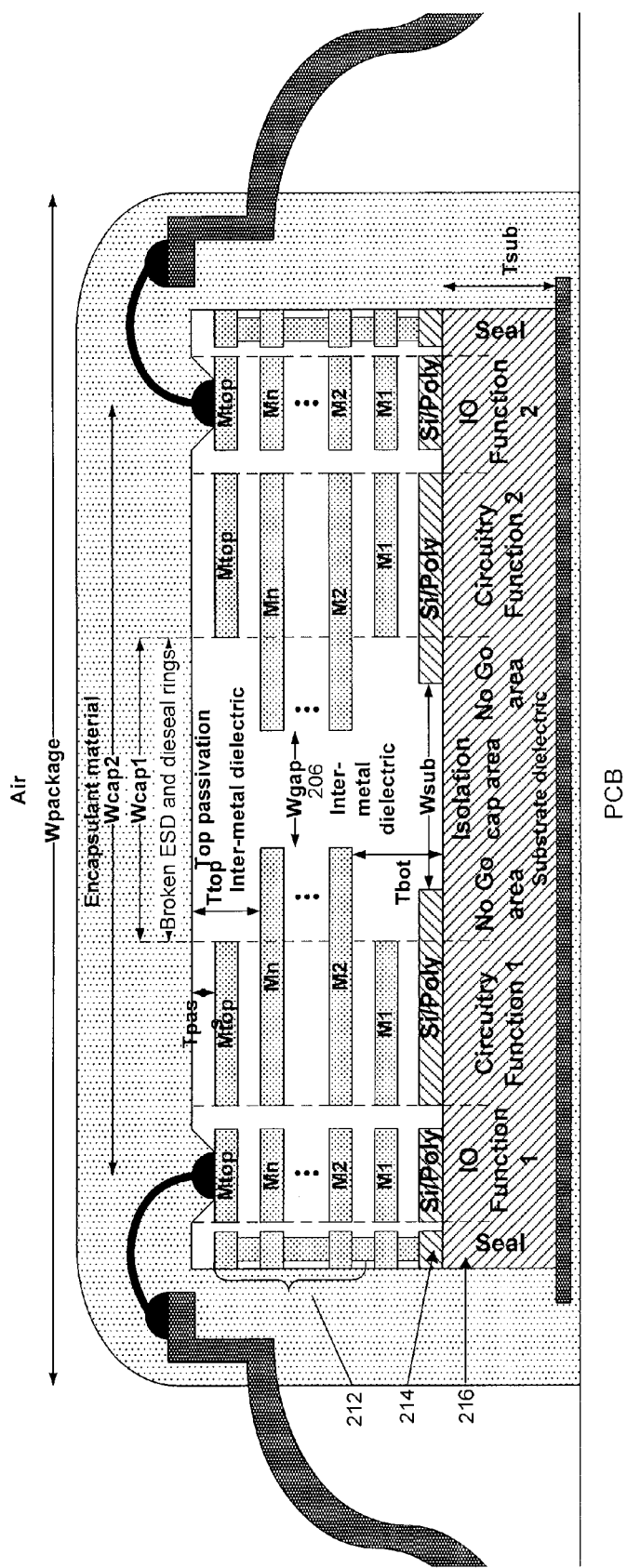
FIG. 3 is a schematic cross-sectional side view of an embodiment of an isolator having a lateral gap coupling capacitor.

As shown in the cross-sectional side views of FIGS. 2 and 3, a single-chip high-speed high-voltage isolator includes one functional or circuit block 202 communicating with another functional or circuit block 204 via at least two capacitive connections 206 (only one of which is visible in FIG. 2), each capacitive connection 206 being formed by a corresponding pair of mutually spaced metal electrodes or 'plates' 208, 210. It should be understood that although the mutually spaced electrodes of the capacitors described herein may be generally referred to herein as 'plates' in accordance with conventional electronics, this should not be understood as placing any limitation on the physical shape or configuration of the capacitor electrodes.

In the embodiment of FIG. 2, the metal plates 208, 210 of the capacitor are portions of patterned metal layers of a stack 212 of alternating patterned metal layers and inter-metal dielectric layers disposed on a thin patterned silicon layer 214 which in turn is disposed on a thick dielectric substrate 216, which may be sapphire. The metal layers of the stack 212 include a topmost metal layer Mtop disposed over n patterned metal layers M1, M2, . . . Mn. Although FIG. 2 shows the metal plates 208, 210 as being constituted by the specific metal layers M1 and Mtop of the stack 212, any two or more metal layers from the stack 212 can be used, as long as there is sufficient dielectric thickness between those plates to stand off the rated isolation voltage. Additionally, although not shown in FIG. 2, at least one doped polysilicon layer is typically included in the stack 212, and either or both capacitor plates of a coupling capacitor can be formed from one or more of these doped silicon layers rather than from the metal layers. Additionally, in some embodiments the bottom plate of at least one of the coupling capacitors is formed from the active silicon layer 214. The die is supported on a metal paddle 240 as is typical in packaged integrated circuits.

As shown in FIG. 2, the functional or circuit blocks 202, 204, are mutually spaced by patterning the silicon layer 214 and the metal layers of the stack 212 to define a coupling region 218 containing only dielectric and the metal (and, in some embodiments, silicon) plates 208, 210 providing the capacitive connections 206. Further, each of these metal plates 208, 210 extends only part way across the coupling region 218, leaving 'no go' regions 220 and 241 of widths Wgap2 and Wgap1 between the end of the plate and the edge of the coupling region 218 (and hence also the nearest edge of the corresponding one of the functional or circuit blocks 202, 204). Thus the metal plates 208, 210 overlap in an intermediate region 222 between the two 'no go' regions 220. In addition, the nearest distance of approach between mutually spaced portions of the active silicon layer 214 on either side of the isolation barrier is represented by the dimension Wsub. The dielectric substrate has thickness Tsub. Tox1 is the thickness of oxide under the bottom metal layer in this case, and Tox2 is the thickness of oxide plus passivation above the top metal layer. Tcap is the thickness of oxide between the two plates.

The breakdown path across Tcap is the intended breakdown path, and this dimension is chosen according to the voltage that the isolation capacitor is required to withstand. However, there are other possible "parasitic" breakdown paths, and the other dimensions are chosen in order to ensure they can withstand at least as much voltage as the intended path. A partial list of these other breakdown paths is:

(i) directly from one portion of a metal layer to another portion of a metal layer: Wgap1 or Wgap2 in the oxide;
(ii) from the active silicon layer, along the substrate and up to the nearest metal layer: Wgap2 (substrate)+Tox1 (oxide);
(iii) from the top metal layer, through the dielectric material to the encapsulant, along the encapsulant material and back down through the dielectric material to the top metal on the other side of the isolation barrier: Tox2 (oxide)+Wgap1 (encapsulant)+Tox2 (oxide);
(iv) directly along the substrate between portions of the active silicon layer 214 on either side of the isolation barrier: Wsub (substrate); and
(v) from the active silicon layer down through the dielectric substrate 216 of thickness Tsub to the metal paddle 240 and back up through the dielectric substrate 216 to the active silicon layer 214 on the other side of the isolation barrier: Tsub (substrate)+Tsub (substrate).

Figure 4:
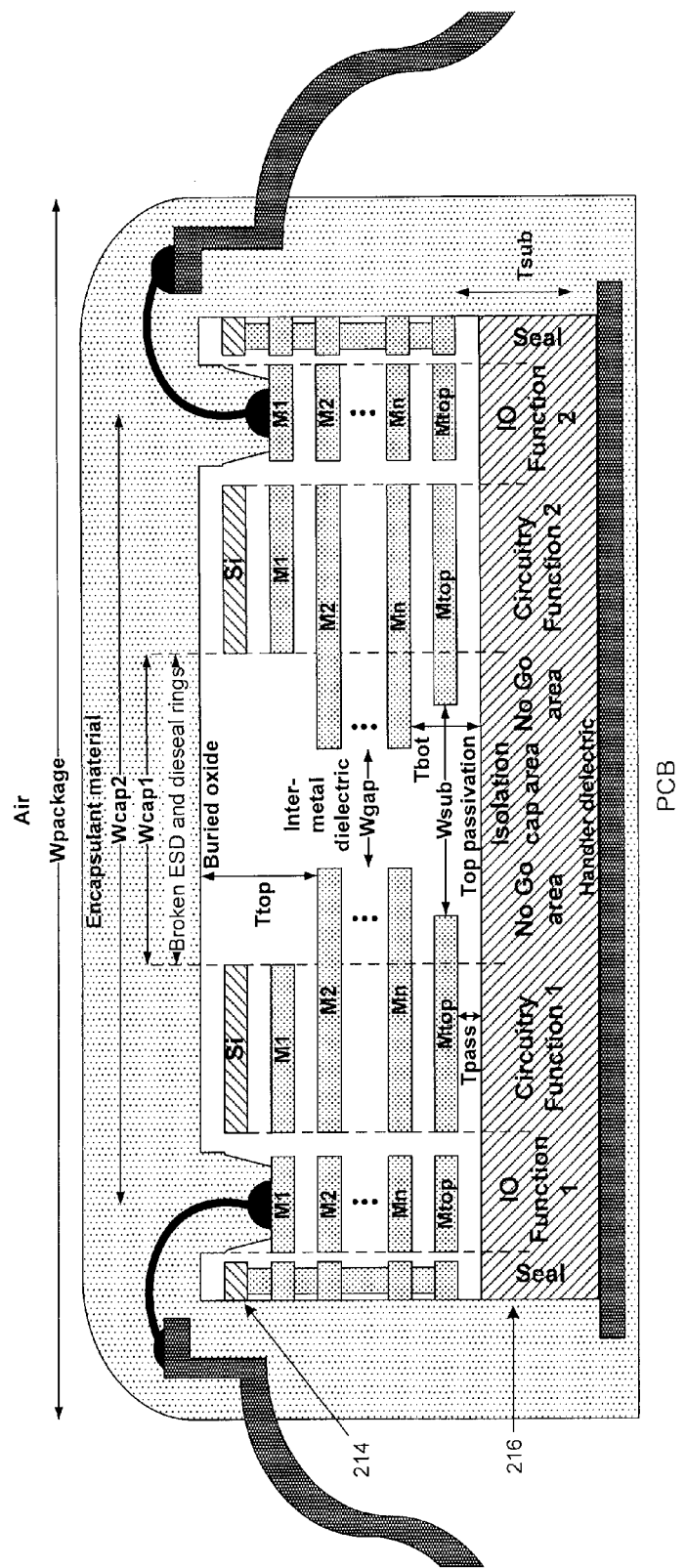
FIG. 4 is a schematic cross-sectional side view of an embodiment of an isolator having a lateral gap coupling capacitor and a topmost active silicon layer, formed using a flipped SOI process.
Figure 10:
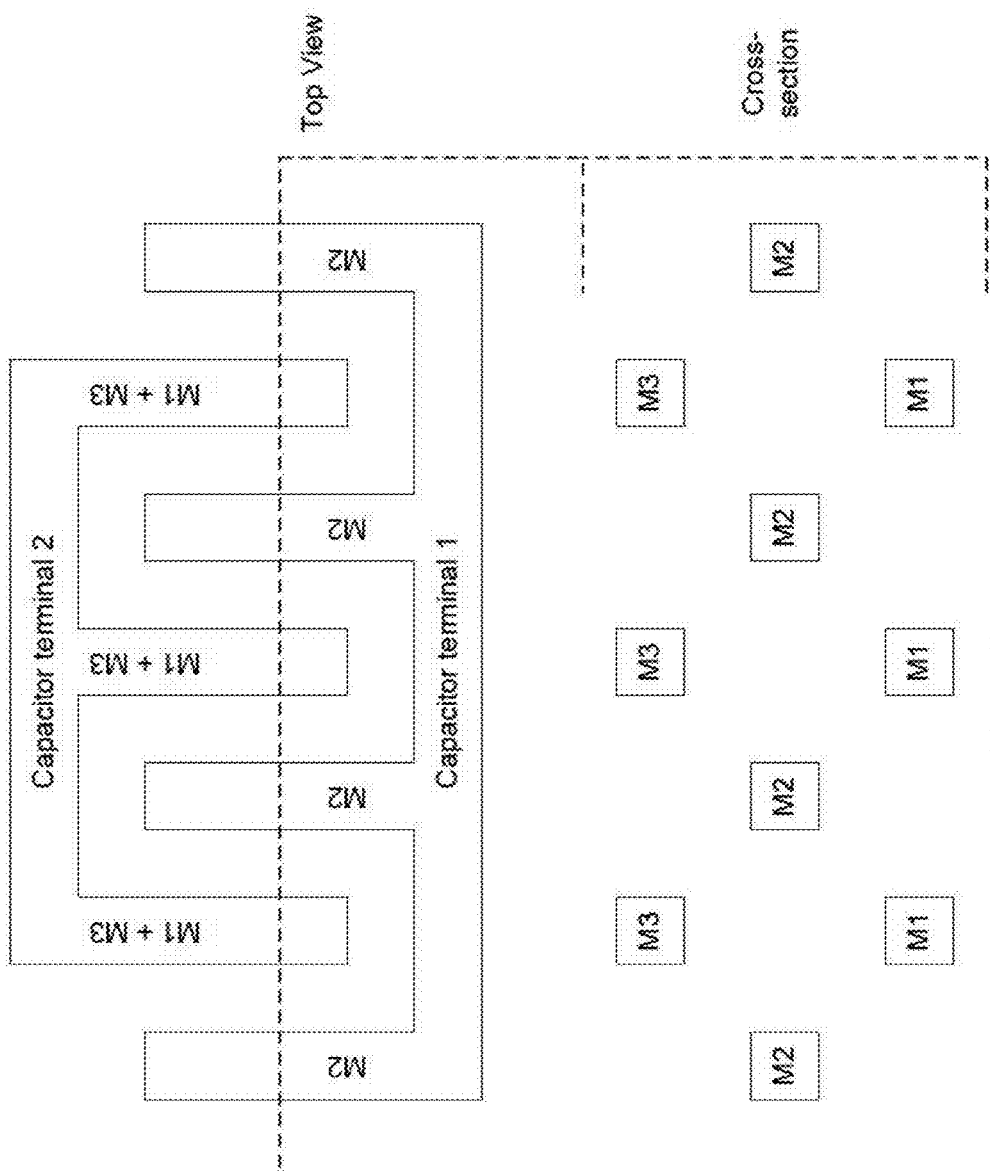
FIG. 10 includes schematic plan and cross-sectional side views of a lateral gap capacitor in the form of interdigitated elongate finger electrodes formed from three metal layers.

Similarly, FIGS. 3 and 4 show dimensions critical for maintaining isolation across the barrier. The calculation of minimum values for these dimensions for some example embodiments is explained in more detail below. Based on these examples, those skilled in the art will be able to readily calculate the dimensions required for variations on the described vertical and lateral capacitor configurations, or indeed other configurations, such as combinations of vertical and lateral stacking as shown in FIG. 10, for example.

Figure 5:
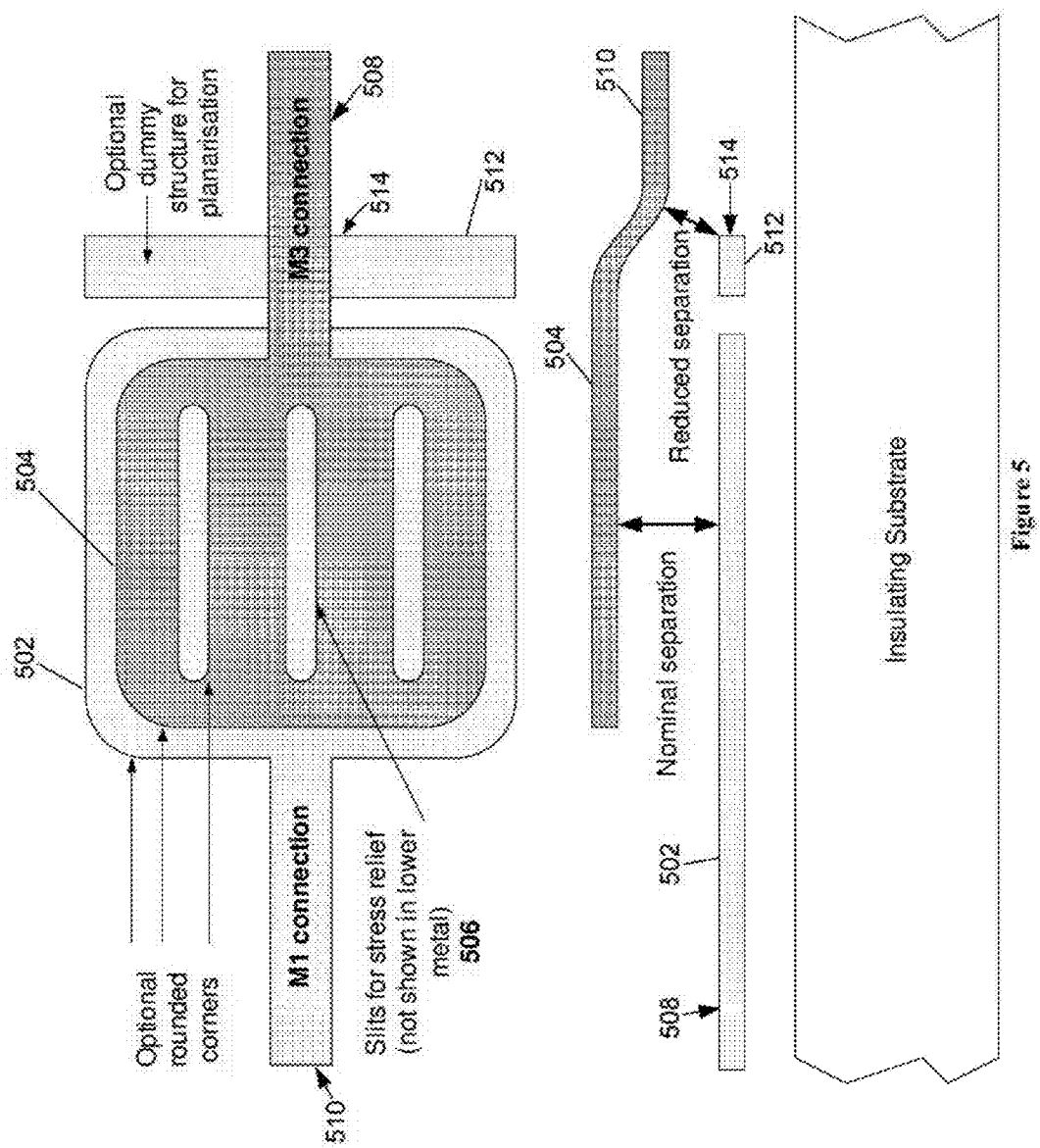
FIG. 5 includes schematic plan and side views of one configuration of mutually spaced metal capacitor plates formed by layers M1 and M3 in accordance with an embodiment of the present invention.

As shown in plan view in FIG. 5, in some embodiments the metal plates 502, 504 of the capacitor may be relatively large, and to provide stress relief to such large areas of metal, each plate 502, 504 may include openings, which in some embodiments are in the form of a series of mutually parallel elongate openings 506, as shown. Additionally, the corners of the plates 502, 504 may be rounded to reduce the electric field concentration at the corners and hence increase the breakdown voltage between the plates 502, 504 and other parts of the device. Additionally, one or more of the plate layers 502, 504 may include one or more electrically isolated dummy structures of metal, purely to assist with planarization.

For example, the plates shown in plan and cross-sectional side views in FIG. 5 are formed from the M1 and M3 metal layers, with the overlying M3 layer plate 504 being generally in the form of a square plate (albeit with rounded corners and elongate openings) in plan view with an elongate portion 508 extending from one side to connect the plate 504 to the corresponding function or circuit block (not shown). The underlying M1 layer plate 502 is of similar form, but the elongate portion 510 of that plate 502 extends in the opposite direction towards the other corresponding function or circuit block (not shown). Because the elongate portion 508 of the overlying M3 layer plate 504 extends across the edge of the underlying M1 layer plate 502, in practice this means that the elongate portion 508 is not necessarily flat or planar, but may have a step corresponding to the edge of the underlying M1 layer plate under the elongate portion 508 of the overlying M3 layer. This step can cause thinning of the inter-metal dielectric layer(s) disposed between the M1 and M3 metal layers, thus providing a reduced separation (and hence potentially preferred breakdown path) between these two metal layers M1 and M3.

By providing an electrically isolated dummy structure 512 in the underlying M1 metal layer, but spaced from the M1 layer plate 502, the steps in the overlying layers, and hence any thinning of the dielectric, are effectively shifted to the outermost edge 514 of the dummy structure 512. Because the dummy structure 512 is electrically isolated, the reduced separation between the M3 layer and the dummy structure is of little or no consequence, and the problem is thus mitigated. It will be apparent to those skilled in the art that the dummy structure 512 should be spaced from the M1 layer plate 502 by a distance that is sufficiently large to avoid providing another preferred breakdown path, but also sufficiently small to shift the dielectric thinning away from the M1 layer plate 502. A spacing between one to two times the nominal plate separation is sufficient for many practical implementations.

As shown in FIGS. 2 to 4, each of the functional or circuit blocks 202, 204 includes an I/O block 224 and a functional block 226. It will be apparent to those skilled in the art that these blocks 224, 226 are represented entirely schematically as complete unpatterned layers of the stack 212 and silicon layer 214, whereas in reality these layers would of course be patterned and may include additional layers in order to define the appropriate functions required of the isolator.

Disposed about each of the functional or circuit blocks 204, 206 is a corresponding seal ring 228, 230 formed by the silicon layer 214 and the stack 212, as described further below. External connections to the I/O regions 224 are made by wire bonding 232 between the top metal layer Mtop and package pins 234, as shown. The entire device is encapsulated within an encapsulant material 236.

In the embodiment of FIG. 3, the capacitive connections 206 are formed by one or more of the metal layers of the stack 212, where each such metal layer defines a corresponding pair of capacitor electrodes by forming a lithographically-defined gap or break in the layer, filled by inter-metal dielectric. In this embodiment, the capacitor 'plates' (i.e., the lithographically-defined edges of the metal layer) are thus oriented vertically, with the gap of dimension Wgap between them being lateral; that is, in a direction parallel to the dielectric substrate 216. As described above, in other embodiments one or more polysilicon layers of the stack 212 and/or the active silicon layer 214 may be configured in this manner in addition to or instead of, one or more of the metal layers of the stack 212.

Figure 6:
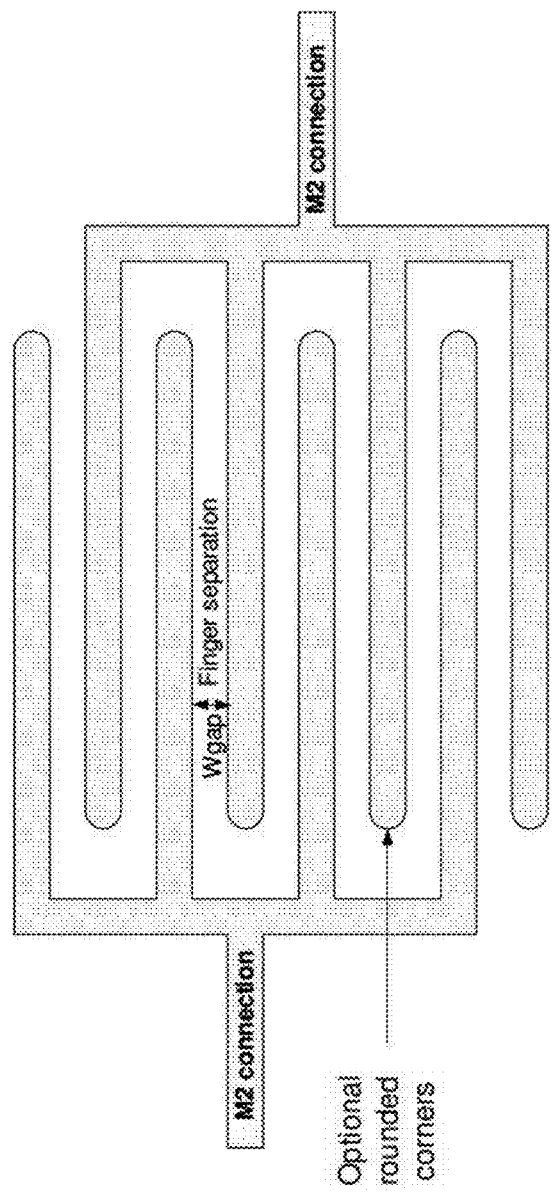
FIG. 6 is a schematic plan view of a capacitor formed by two sets of interdigitated metal fingers with optional rounded corners at the ends of the fingers in accordance with an embodiment of the present invention.

To provide a sufficiently large plate area, each of the one or more metal layers constituting the capacitor plates can be patterned to define the plates in the form of sets of interdigitated 'fingers' in plan view (i.e., as two sets of mutually spaced elongate electrodes, with the electrodes of each set interleaved with the electrodes of the other set), as shown in FIG. 6. In some embodiments, the ends of the elongate electrodes or 'fingers' are rounded with an appropriate radius of curvature (e.g., half the finger width, as shown) to reduce the electric field concentration that would otherwise occur at the sharp edges of the electrodes. As with the embodiment of FIG. 2, one or more of the metal layers, one or more polysilicon layers (not shown), or even the active layer 214 can be used in forming each capacitor. Although FIG. 3 shows the closest point of approach of a single pair of fingers of each of metal layers M2, . . . Mn, in practice, many parallel finger electrodes can be used to increase the total capacitance. The closest point of approach between the electrodes is selected to be sufficiently large so that the inter-metal dielectric in the gap can withstand the required isolation voltage without breaking down.

Moreover, the vertical and lateral capacitor plate configurations described above can be combined in a variety of ways; for example, wherein a lateral capacitor is formed with alternating sets of fingers at different heights. This can increase the total capacitance by increasing the vertical and horizontal fringing electrical fields. For example, FIG. 10 shows plan and cross-sectional side views of three interdigitated finger electrode structures formed from the M1, M2, and M3 metal layers, respectively. The M1 and M3 electrode structures are identically patterned to each provide three elongate electrodes or fingers interconnected by a busbar or terminal. In plan view, the M3 structure lies directly on top of the identically shaped M1 structure, but in side view these structures are mutually spaced with inter-metal dielectric disposed therebetween. The M2 layer structure is similar but provides four elongate finger electrodes, in plan view disposed symmetrically about and between the three M1 and M3 fingers, in plan and side views, respectively.

Figure 14A:
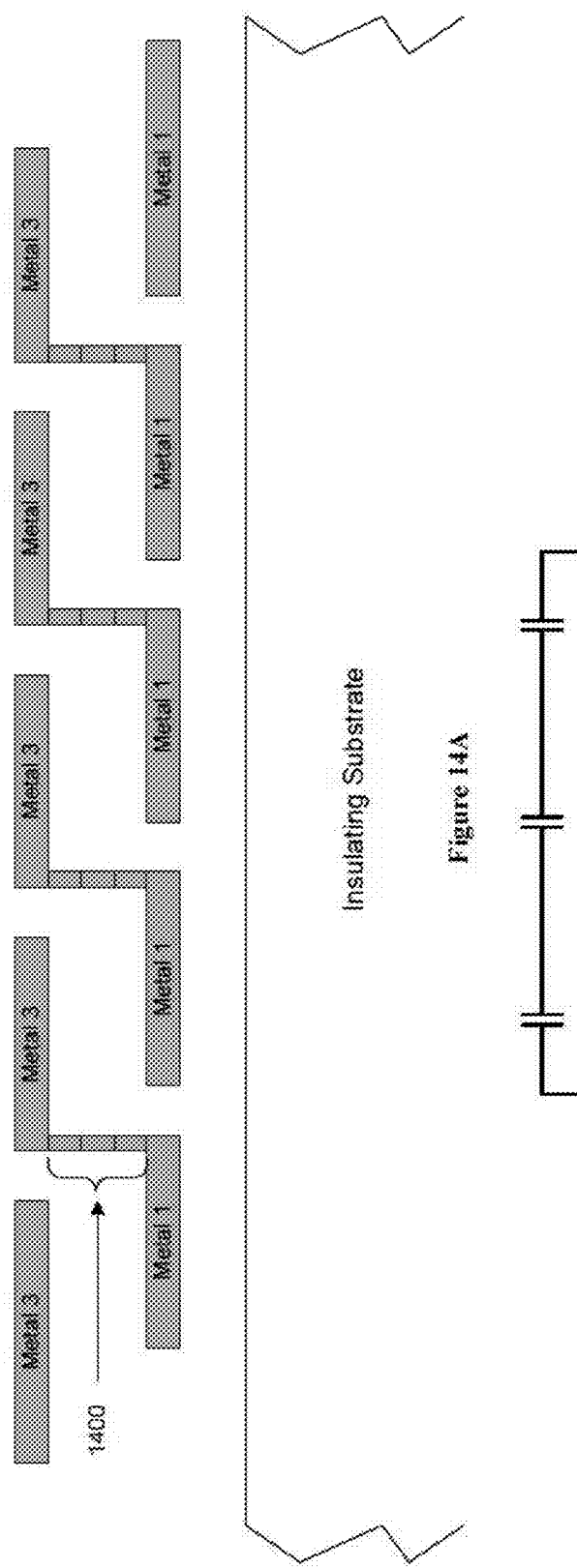
FIG. 14A is a schematic cross-sectional side-view of an embodiment of an integrated circuit with capacitors formed by overlapping metal layers.
Figure 14B:
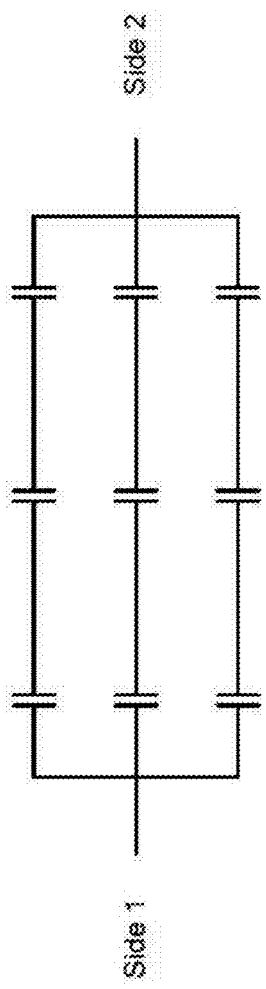
FIG. 14B is a circuit diagram showing one possible series/parallel interconnection of the capacitors described herein.

Additionally, any number of these capacitors can be connected in series to increase the breakdown voltage of the overall device, although this generally requires the other possible breakdown paths of the device be similarly robust, as described further below. An example embodiment showing a series connection of overlapping Metal 1-Metal 3 capacitors is shown in cross-sectional side view in FIG. 14A. The capacitors are electrically connected by intermediate metal vias or layers 1400 as commonly used in semiconductor processing. The capacitors in FIG. 14A may be electrically interconnected as shown in the example in FIG. 5. Similarly, the interdigitated finger electrode capacitors described herein may be connected in series. In addition, any of the capacitors described herein can be connected in series, or in parallel (to increase coupling capacitance), or in a series/parallel combination, such as that shown in FIG. 14B. Many other variations in capacitor structure and series/parallel interconnection topologies will be apparent those skilled in the art in light of the disclosure herein.

Choice of Substrate

The isolators described herein can be produced using standard semiconductor device processing techniques and equipment known to those skilled in the art. The embodiments described above use a thin silicon film 214 disposed on a thick dielectric layer or substrate 216, the latter providing electrical isolation. This general arrangement is conveniently provided by using a silicon-on-insulator (SOI) wafer as the starting material or substrate for processing. The most common form of SOI wafer available commercially consists of a silicon handle wafer having a buried oxide layer on which is disposed a thin silicon layer on the top surface of the wafer. The thickness of the buried oxide layer in these SOI wafers is typically about 100 nm to 1 µm, but can be greater than 2 µm. To make such a substrate compatible with high-voltage (kV) applications, trench isolation or field oxidation needs to be used to either remove or fully oxidise the parts of the thin silicon layer between functional blocks; i.e., across the capacitive barrier. Some SOI wafers have very thin active silicon layers, such that even field oxidation of selected portions in the layer fully oxidises those portions and thus isolates the remaining unoxidised portions of the layer from each other. SOI wafers with thicker silicon layers may require extra deep field oxidation or the use of trench etching to fully isolate the functional blocks.

Other silicon-on-insulator substrates can be used, where the layer underneath the buried silicon dioxide layer is not silicon but an insulating material such as silica glass, diamond, or an oxide, nitride, fluoride, or carbide compound. These substrates can be produced using standard layer transfer processes well documented in the literature and known by those skilled in the art. In addition, insulating substrates touching the active silicon directly, without the presence of an interposing silicon dioxide layer, may also be used.

Another form of silicon-on-insulator wafer consists of a topmost silicon layer attached to a thick dielectric layer or bulk dielectric substrate. Such wafers can be formed by bonding a pre-existing silicon layer to the dielectric, or by in situ deposition or growth of the silicon layer on the dielectric. Where the dielectric has a compatible single-crystal structure, a single-crystal silicon layer can be epitaxially grown on the dielectric. Such thick dielectric substrates include grown or bonded silicon-on-sapphire (SOS) wafers.

Irrespective of the form of SOI substrate or SOI wafer used, either trench etching or field oxidation can be used to completely remove selected portions of the active silicon layer across the capacitive coupling region. In the case of commercially available SOS wafers, this happens naturally as the field oxidation separates the remaining portions of the active silicon layer from each other completely. Standard CMOS processing steps can be used thereafter to produce the other components of the isolator, including gate formation, doping, contact ILD (inter-layer dielectric) deposition, etching, multiple levels of metal and ILD formation and etching, and top level passivation and etching.

In addition to the different capacitor configurations described above, in some embodiments the active silicon or 'device' layer 214 is on top of the metal layers, rather than underneath them as shown in FIGS. 2 and 3. For example, the isolator shown in FIG. 4 includes a lateral capacitor configuration as in the embodiment of FIG. 3, but the silicon layer 214 is near the top of the isolator rather than being disposed on the dielectric substrate 216. These 'inverted' or 'flipped' embodiments can be produced by applying (to a standard buried oxide SOI wafer) the same processing steps used to produce a corresponding non-inverted embodiment (e.g., the isolator of FIG. 3), including the top passivation, but not etching the contact pad openings. The entire resulting processed wafer is then bonded (by its passivation side) to a dielectric handle wafer or substrate. The silicon substrate or handle portion of the original SOI wafer is then completely removed while leaving behind the buried oxide layer. Subsequently, etch pad openings are formed through the buried oxide, contacts made, and the device encapsulated to provide the device configuration shown in FIG. 4. Removing the silicon handle of the SOI wafer eliminates the breakdown paths and capacitance associated with it.

In yet some further embodiments, after the silicon handle removal step, a further dielectric wafer or superstrate is bonded to the exposed oxide layer in order to increase the high voltage breakdown strength of the isolator. The contact pads can then be made through either one of the dielectric sub/super-strates of the resulting 'sandwich' structure. If the contacts are made through the first bonded dielectric wafer, then the resulting device can be inverted once again so that the active silicon layer 214 once again is disposed beneath the metal-dielectric layer stack 212.

Layout to Maintain Isolation

In addition to the capacitor configurations, other layout considerations are also important for maintaining isolation. In particular, the final packaged isolator includes the following materials which have an impact on the isolation:

(i) the air that surrounds the packaged isolator. This medium has the lowest dielectric strength and sets the minimum required width of the package itself;

(ii) the encapsulating material (typically a plastic) which forms a seal around the die and excludes air pockets. This material typically has a dielectric strength higher than air, but lower than the inter-metal dielectric and passivation on the die itself;

(iii) the inter-metal dielectric, typically an oxide;

(iv) the top passivation dielectric of the die, typically an oxide and/or nitride;

(v) the substrate dielectric, which may be the buried oxide of an SOI wafer, sapphire, a glass or other dielectric material;

(vi) where applicable, a conductor or semiconductor below the dielectric substrate. In the case of a buried-oxide SOI wafer, this is the silicon handle wafer below the buried oxide; and (vii) the metal paddle that is typically present below the die in packaged dies and a corresponding conductive or non-conductive layer of die-attach material.

When laying out the circuit, including the capacitors, all of the possible breakdown paths need to be considered. For both the vertical and lateral capacitor configurations, the possible breakdown paths include:

(i) between the exposed package pins 234, through the air;

(ii) between the die pads (at the points where the bondwires 232 attach), through the encapsulant 236;

(iii) between portions of the active silicon layer 214, either laterally through the dielectric, or vertically down through the substrate to the conductive layer (e.g., the silicon handle or metal paddle, if either or both of these are present) or encapsulant 236 (if there is one on that side of the isolator), along the conductive layer or encapsulant, and up again through the substrate;

(iv) between the top metal layers, either laterally through the inter-metal or passivation dielectrics, or vertically up through the passivation layer, along the encapsulant 236, and down again through the passivation layer.

In addition, the lateral capacitor configurations include the following additional possible breakdown paths between the capacitor plates:

(v) vertically up through the inter-metal and passivation dielectrics, along the encapsulant 236 and down again through the passivation and inter-metal dielectrics; and (vi) vertically down through the inter-metal dielectric, laterally along the substrate and vertically upwards again through the inter-metal dielectric.

Depending on the thicknesses and dielectric strengths of the various materials described above, the layout needs to be configured such that all of the above potential breakdown paths can tolerate the required isolation voltage. For a given path that passes through materials M1 ... Mn with corresponding dielectric strengths E1 ... En (V/μm), and wherein the path length through each material is L1 ... Ln (μm), the total isolation strength of the path is:

$$V = E1*L1 + \ldots + En*Ln$$

Some worked examples are given below:

EXAMPLE 1

Lateral Capacitors on an SOS Substrate

Inter-metal and passivation oxide dielectric strength: 1000V/μm
Encapsulant dielectric strength: 15V/μm
Sapphire dielectric strength: 50V/μm
Air: 2V/μm
Top passivation thickness Tpass: 1 μm If 5 kV of isolation tolerance is required, the dimensions shown in FIG. 3 are selected to have the following minimum values:

(i) Wsub=100 μm (active layer 214 Si—Si breakdown through the sapphire substrate 216);

(ii) Tsub=50 μm (active layer 214 Si—Si breakdown down through substrate 216 to conductive layer or encapsulant 236);

(iii) Wgap=5 μm (lateral breakdown through the dielectric between the capacitor plates);

(iv) Tbot=2.5 μm (breakdown between capacitor plates down to substrate 216;

(v) Ttop=2.5 μm (breakdown between capacitor plates up to encapsulant 236);

(vi) Wcap1=200 μm (breakdown between top metals up to and through the encapsulant 236);

(vii) Wcap2=333 μm (breakdown between contact pads or bonding wires through encapsulant 236); and (viii) Wpackage=2.5 mm (breakdown between exposed package pins 234—as mandated by standards).

EXAMPLE 2

Lateral Capacitors on a Buried-Oxide SOI Substrate

The dielectric strength of the buried oxide (BOX) on SOI dies is much higher than that of sapphire; in this example 1000V/μm.

For 5 kV isolation, the dimensions given for the SOS example above apply, with the exception of the following:

(i) Wsub=5 μm; and
(ii) Tsub=2.5 μm

Sealring Configurations

Sealrings (also referred to in the art as 'die seals') are used around integrated circuits to protect the circuitry on the die from contaminants diffusing in from the encapsulant material and also to prevent cracks propagating into the chip. Typically, a sealring is composed of several continuous rings of metal, polysilicon and active silicon around the circuit core and spaced as close to the core as possible to reduce the overall die area, and is electrically grounded. However, the inventors have determined that the sealring represents a breakdown path across the isolation barrier.

Consequently, to achieve high voltage (kV) isolation, the inventors have determined that the standard sealring configurations need to be modified. Although it is possible to omit the sealring entirely to remove its breakdown paths, in practice this may not be desirable, because its protective function would be lost entirely. One modification is to increase the lateral separation between the sealring 228, 230 and core circuitry 226 (e.g., to >10 μm for kV isolation), depending on material thicknesses and dielectric strengths, and to electrically float the sealring. In Example 1 above, the lateral separation of the sealring to the core circuitry 226 would need to be 50 μm on each side of the die (half of Wsub). For a 2 mm×2 mm die, a 50 µm gap between the sealring and the core circuitry 226 would introduce a 10% area penalty, which is quite severe.

Figure 11:
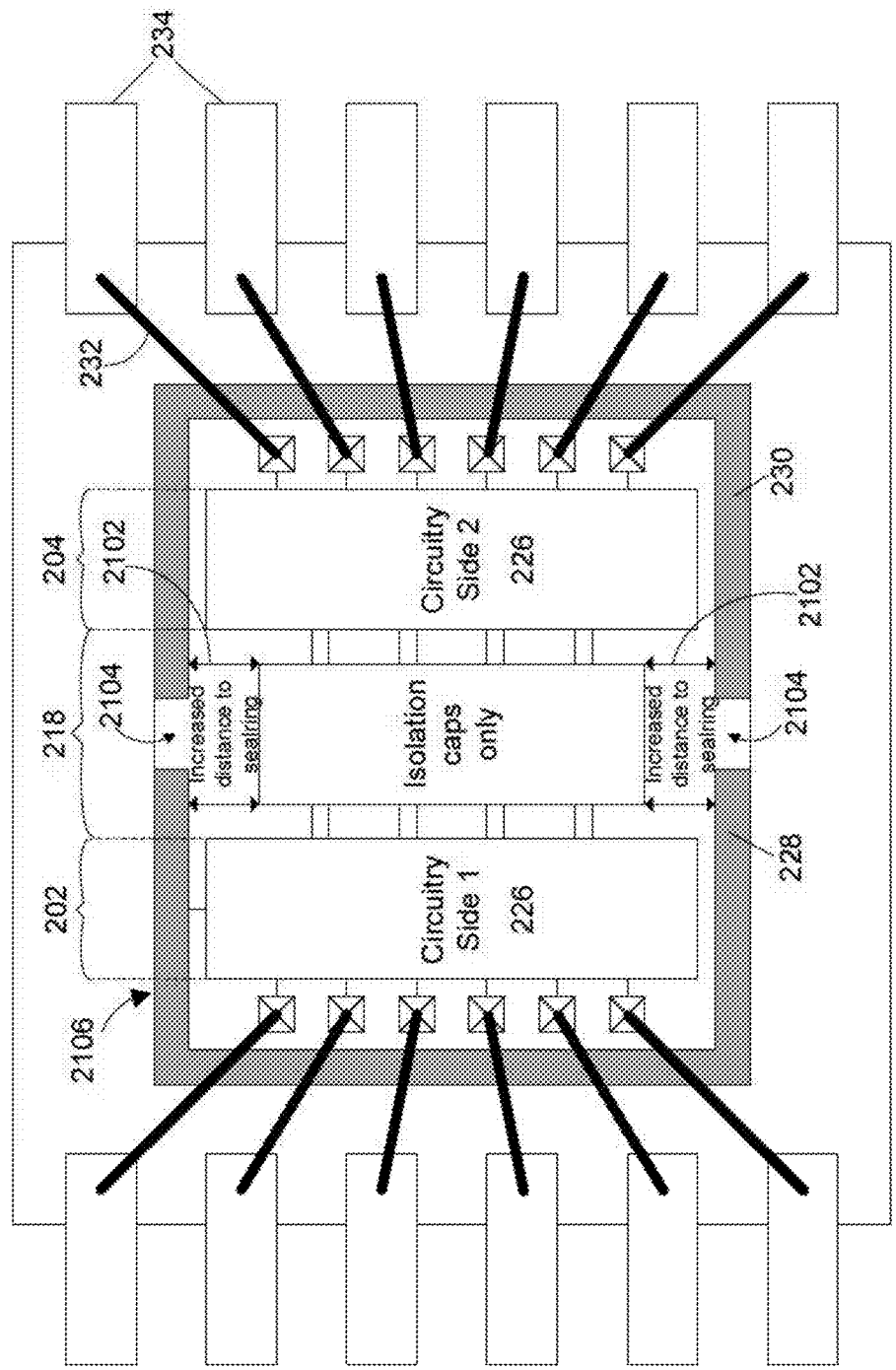
FIG. 11 is a schematic plan view of an integrated circuit die having two mutually spaced and mutually isolated integrated circuit portions coupled by capacitors disposed in a coupling region between the integrated circuit portions.

Another modification (which may be used either independently or in combination with the first modification) is to introduce breaks 2104 in the sealring 228, 230 in the isolation region 218, as shown in the embodiments of FIGS. 11 and 2 to 4, so that the sealring 228, 230 is discontinuous across the coupling region 218. Where the sealring is broken in this manner, each of the mutually spaced sealring portions 228, 230 can be electrically connected to the corresponding local ground. As shown in FIG. 11, adjacent to each break or gap 2104 in the die seal 228, 230, it may be necessary in some embodiments to increase the distance 2102 from the die periphery 2106 to the coupling region 218 to increase the distance any contaminants need to penetrate before affecting the isolator. As this is needed only on parts of the chip perimeter near the coupling region 218, the area penalty is relatively small.

Figure 12A:
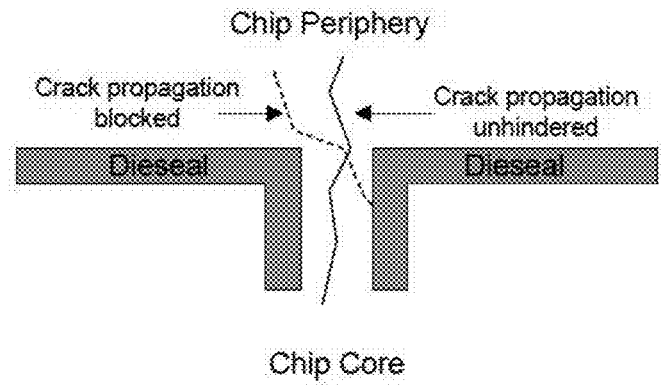
FIGS. 12A to 12E are schematic diagrams illustrating various configurations of the die seal that limit or block lines of sight from outside the die seal to the circuitry within the die seal.
Figure 12B:
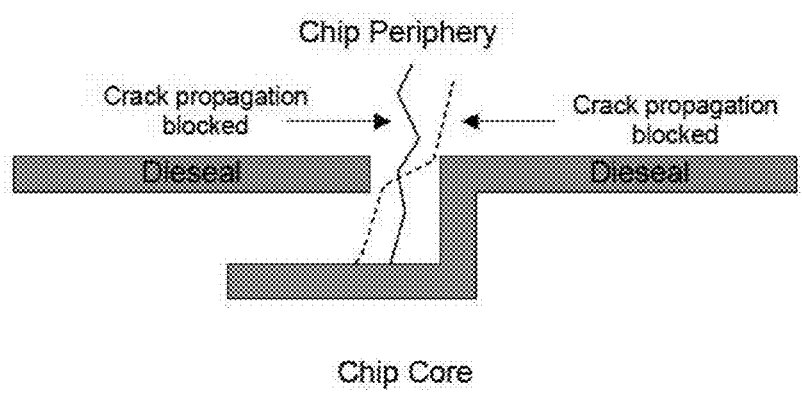

However, breaks or gaps 2104 in the sealring can provide a path for cracks to propagate from outside the die seal into the chip core. To inhibit this, in some embodiments the die seal does not simply stop at the break or gap 2104, but at least one of the ends of the die seal at the gap is configured to reduce the range of angles of possible linear or nearly linear crack propagation paths passing through the gaps from outside the die seal to regions inside the die seal. To put this another way, these configurations either limit or block 'lines of sight' (i.e., linear paths) from outside the die seal to regions inside the die seal. For example, FIG. 12a shows a die seal configuration that allows only linear or substantially linear cracks that propagate in a substantially perpendicular direction to the break 2104 to pass unhindered into the chip core. Cracks propagating at other angles are blocked by the portions of the die seals that extend away (in this example, orthogonally) from the other portions of the die seal. FIG. 12b shows an example die seal configuration that blocks all linear or nearly linear paths of crack propagation into the chip core.

Figure 12C:
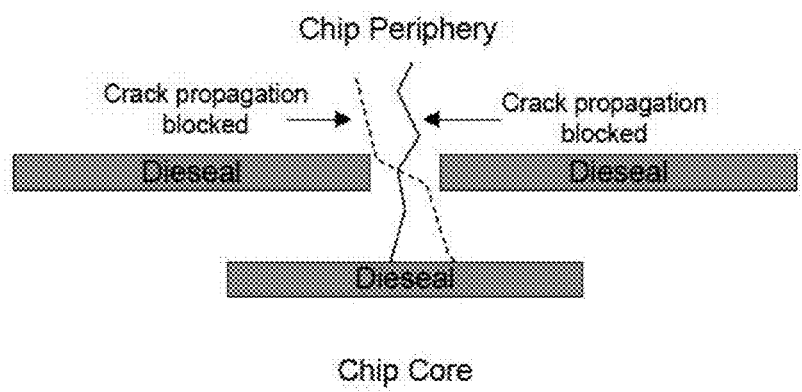
Figure 12D:
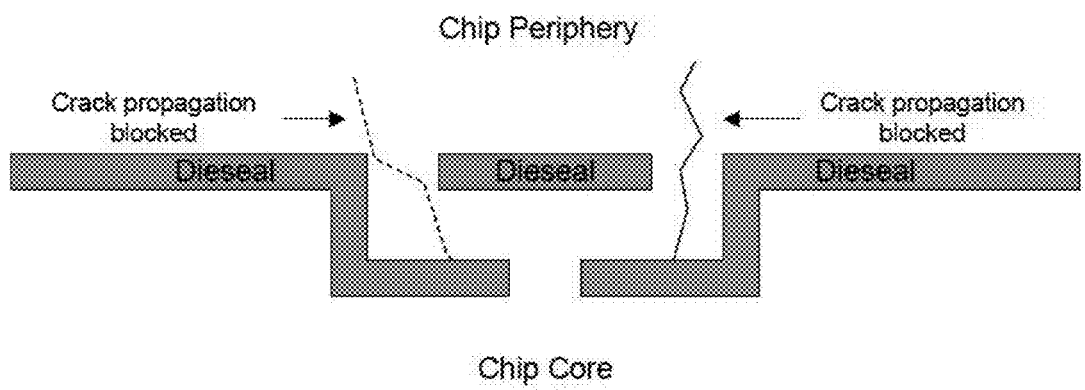
Figure 12E:
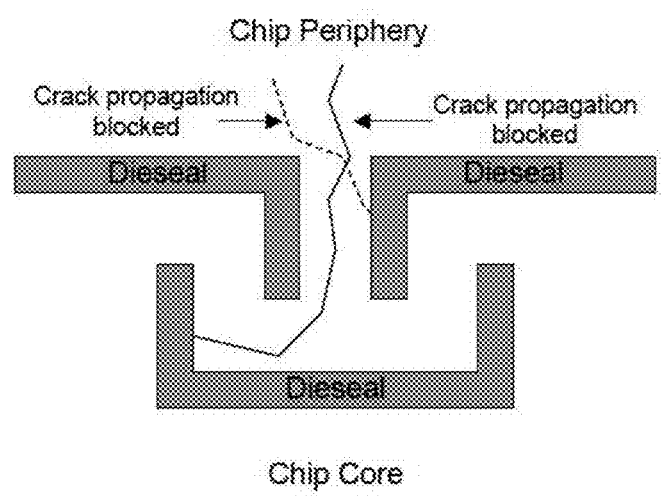

Additionally or alternatively, one or more additional and spaced die seal segments can also be used at the die seal gap. For example, in the embodiment of FIG. 12c, a physically and electrically isolated section of die seal is added spaced from the other die seal portions and adjacent to the break or gap between those other portions. This additional "wall" or "fence" structure of die seal constitutes a crack blocking structure that is effective at preventing crack propagation because it removes any linear or straight line paths through the gap in the die seal. In other embodiments, the features of the embodiments described above are combined by configuring at least one of the ends of the die seals at the gap to limit paths into the circuitry regions within the die seal and also providing one or more freestanding or spaced structures, such that the combination of these features blocks such paths. For example, FIGS. 12d and 12e show embodiments that are effective at blocking curved or meandering lines of crack propagation. Others such arrangements utilising more complex geometric arrangements or multiple "walls" or "fences" will be readily apparent to those skilled in the art. Such arrangements can be described as maze-like die seal structures that allow only convoluted paths from outside the die seal to circuitry regions inside the die seal. Furthermore, the additional die seal sections do not necessarily have to be placed towards the core side (inside) of the chip, as shown in FIGS. 12c to 12e, but can alternatively be located outside the die seal.

Figure 13:
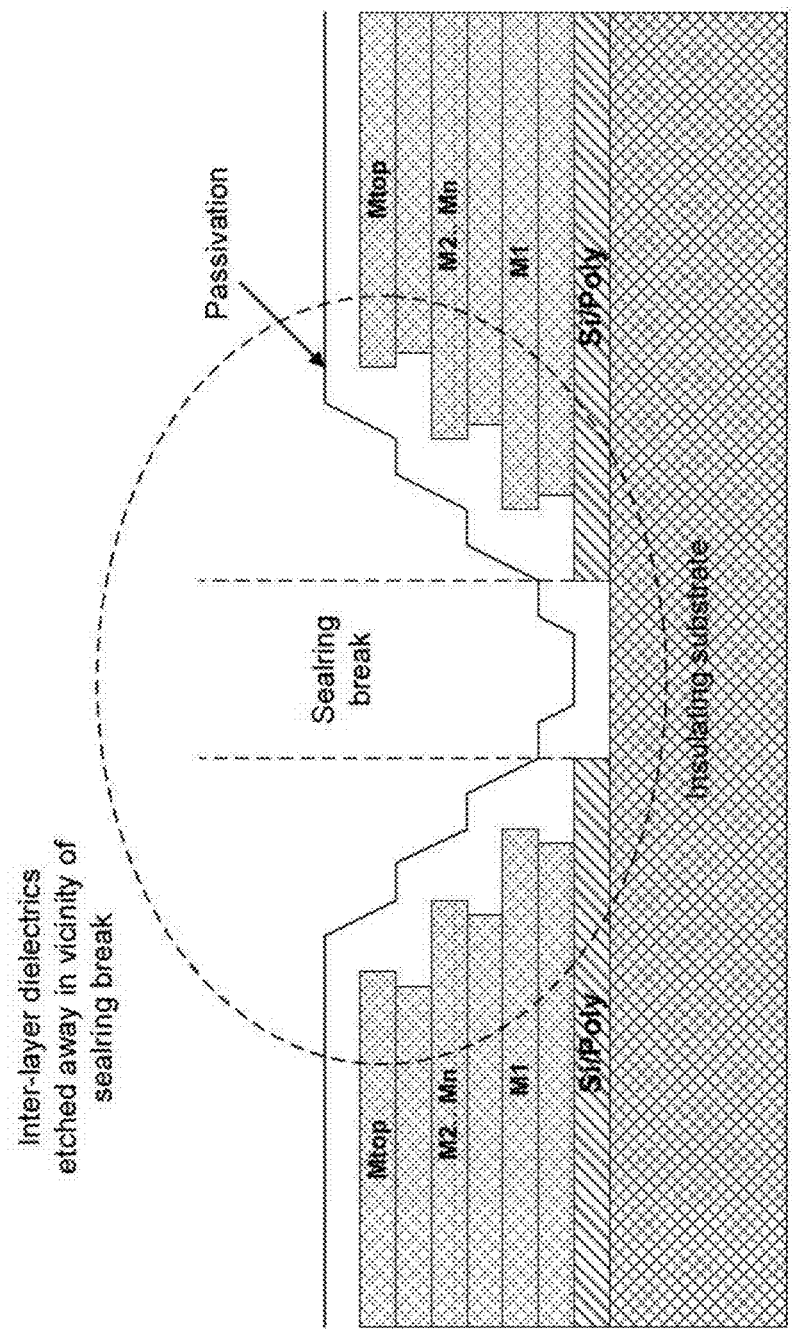
FIG. 13 is a schematic cross-sectional side-view of an embodiment of an integrated circuit wherein the layers of the stack are stepped near the edges of the coupling region to improve the uniformity of the passivation layer disposed thereover.

The breaks 2104 in the die seal also provide a path for contaminant diffusion into the chip. Such contaminants typically diffuse along the inter-layer dielectrics, as these are usually the most porous materials in the die stackup. To inhibit this, as shown in cross-section in FIG. 13, in some embodiments the inter-layer dielectrics are etched away in the vicinity of the gap in the die seal to expose a portion of the substrate, thus allowing the passivation material (typically a nitride or other contaminant resistant layer) to be directly deposited over the die seal and the exposed portion of the substrate in the gap. As shown in FIG. 13, in some embodiments the die seal materials are etched in a stepped or tapered manner so that a portion of the upper surface of each layer is exposed, thereby forming a stepped or sloped valley rather than an abrupt cliff at the gap 2104. This configuration allows the passivation material to be directly deposited on the exposed portions of each die seal layer, thereby improving the uniformity of the passivation material coating. This configuration can be used in combination with discontinuous die seal configurations such as those shown in FIGS. 12a to 12e.

ESD Protection

ESD (electrostatic discharge) protection is important for protecting integrated circuits from static electricity damage during assembly and normal use. It is common practice to add ESD protection circuitry on all JO pads. The most common methods used commercially are to clamp every JO pad to either a common ESD conductor (often to ground using a Zener diode, or a snapback device in parallel with a diode), or to a pair of ESD conductors (usually power and ground lines) via diodes and separate clamping of the two conductors.

The isolators described herein provide galvanic isolation on a single die. It is not, therefore, practical to have a common ESD network across all parts of the die each isolated part needs to have a separate independent ESD network to protect each isolated part from local ESD events. However, it is also important to consider ESD events that occur between two isolated parts of the die. Therefore, the internal isolation capacitor terminals also need to be included in the corresponding ESD protection network and are treated in the same manner as chip IOs in terms of ESD protection.

Figure 7A:
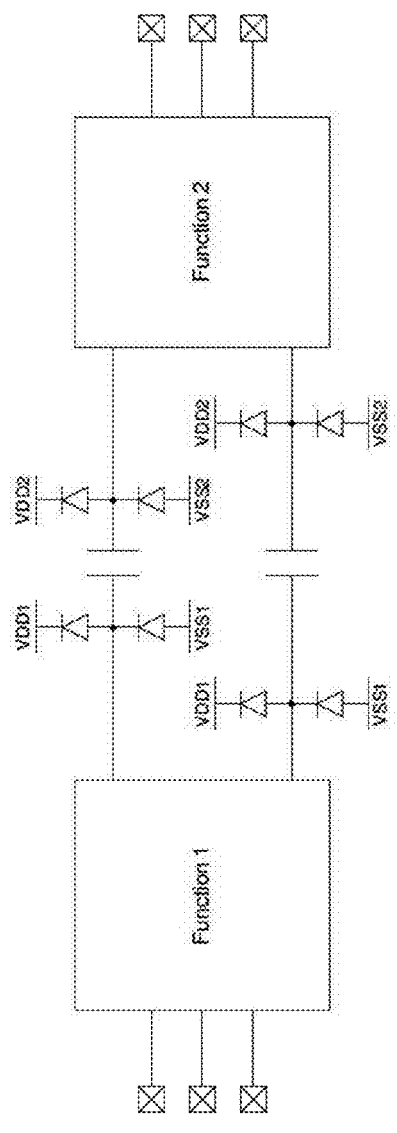
Figure 7B:
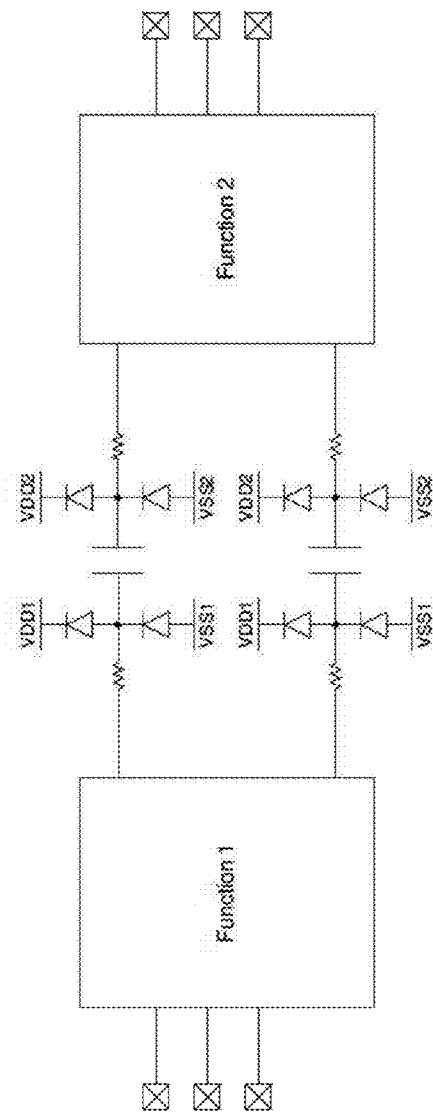
Figure 7C:
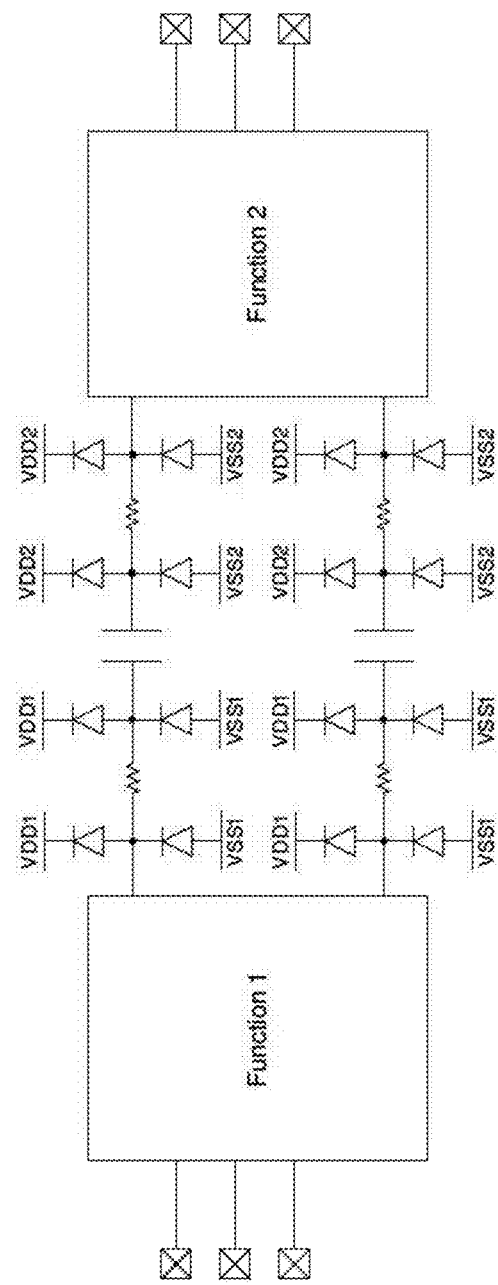

FIG. 7A shows one example of using primary diodes to shunt ESD current to the ESD protection network on each side of the isolation barrier. FIG. 7B shows another example with series resistors between the primary diodes and the functional circuit blocks. FIG. 7C shows yet another example with two sets of shunt diodes on each side of each coupling capacitor with series resistors between each pair of diodes.

FIG. 8A shows another example where a parallel combination of a clamping device and a diode is used to shunt ESD current to the ground lines VSS1, VSS2 on each side of each capacitor. The clamping device is shown schematically as being a Zener diode, but can be any clamping circuit, including a snapback device or a gate-coupled FET. The parallel diode may or may not be required, depending on the voltage limiting characteristics of the clamping device for negative ESD pulses. In some embodiments, series resistors are included between each diode/clamp and the corresponding integrated circuit portion, as shown in FIG. 8B. Additionally, a second diode/clamp network can be included on each side of each capacitor, with each series resistor disposed between a corresponding diode/clamp pair, as shown in FIG. 8C.

Rather than shunting ESD current to the ground lines VSS1 and VSS2, the current can be shunted to the supply lines VDD1, VDD2 as shown in FIG. 9, or indeed, to any other designated ESD conductor.

The size of the protection elements on the internal terminals can be significantly shrunk compared to those present in normal chip IOs because the energy that needs to be absorbed during an ESD event that bridges the isolation barrier is much lower than normal. Essentially, the isolation capacitors themselves charge up to the ESD voltage quickly, limiting the flow of current. The voltage stored across the isolation capacitors then slowly dissipates over time due to capacitor leakage. As long as the isolation capacitors can tolerate the voltage applied by the ESD event (e.g., 2 kV), the circuit remains functional. By shrinking the protection elements, the parasitic capacitance on the isolation lines is reduced, thereby allowing higher speed communications.

Many modifications will be apparent to those skilled in the art without departing from the scope of the present invention.

The invention claimed is:

1. An integrated circuit, including:
   integrated circuit portions mutually spaced on a single electrically insulating die and at least one coupling region on the die to provide capacitive coupling between the otherwise mutually isolated integrated circuit portions;
   the integrated circuit portions being formed by a plurality of layers on the single die, the layers including a plurality of metal layers, a plurality of dielectric layers, and at least one semiconductor layer;
   wherein at least one of the dielectric layers extends from the integrated circuit portions across the coupling region and at least a corresponding one of the metal layers and/or at least one semiconductor layer extends from each of the integrated circuit portions and partially across the coupling region to form capacitors therein and thereby provide the capacitive coupling between the integrated circuit portions; and
   a discontinuous die seal around the rated circuit portions, the discontinuous die seal being the form of mutually spaced die seal portions separated by gaps disposed at locations corresponding to the at least one coupling region;
   wherein the discontinuous die seal is configured to restrict or block lines of sight from outside the die seal to any of the integrated circuit portions or any of the at least one coupling region to inhibit crack propagation thereto from outside the die seal.

2. The integrated circuit of claim 1, wherein the capacitors include at least one capacitor formed by a mutually spaced pair of layers selected from the metal layers and the at least one semiconductor layer.

3. The integrated circuit of claim 1, wherein the capacitors include at least one capacitor formed by mutually spaced portions of a layer selected from the metal layers and the at least one semiconductor layer.

4. The integrated circuit of claim 1, wherein the capacitors include at least one capacitor formed by mutually spaced portions of a layer selected from the metal layers and the at least one semiconductor layer, the mutually spaced portions being configured to define at least one set of interdigitated finger electrodes.

5. The integrated circuit of claim 1, wherein the capacitors include a plurality of capacitors connected in series and/or parallel.

6. The integrated circuit of claim 1, wherein the capacitors include at least one capacitor formed by a corresponding pair of mutually spaced electrodes formed from a respective layers selected from the metal layers and the at least one semiconductor layer, and the corners of the electrodes are curved to reduce the electric field concentration at said corners.

7. The integrated circuit of claim 1, further comprising an electrically isolated dummy region disposed in the coupling region to reduce thinning of one or more dielectric layers forming the capacitors.

8. The integrated circuit of claim 1, wherein the die seal is spaced from the integrated circuit portions by at least 10 µm.

9. The integrated circuit of claim 1, wherein the discontinuous die seal further includes at least one additional electrically isolated die seal structure spaced from the die seal portions and configured to inhibit crack propagation thereto from outside the die seal.

10. The integrated circuit of claim 1, wherein the metal and dielectric layers have a stepped configuration in side view in the vicinity of the gaps to allow a passivation material to directly coat the die seal materials and the insulating substrate at the gaps, thereby forming a contaminant resistant seal.

11. The integrated circuit of claim 1, wherein the mutually spaced die seal portions are spaced from the at least one coupling region by at least 10 µm.

12. The integrated circuit of claim 1, wherein each of said integrated circuit portions is capacitively coupled to a corresponding other of said integrated circuit portions via a corresponding pair of said capacitors, each said capacitor being connected to each said integrated circuit portion by a corresponding conductor; and
   wherein one or more corresponding ESD components are connected between the corresponding conductor and one or more sinks for electrostatic discharge.

13. The integrated circuit of claim 1, wherein the electrically insulating die includes a sapphire layer or substrate.

14. The integrated circuit of claim 1, wherein the electrically insulating die includes a silicon-dioxide layer or substrate.

15. The integrated circuit of claim 1, wherein the electrically insulating die includes a silicon-dioxide layer having a thickness less than or equal to 2 µm thick.

16. The integrated circuit of claim 1, wherein the electrically insulating die includes a silicon-dioxide layer having a thickness greater than 2 µm.

17. The integrated circuit of claim 1, wherein the electrically insulating die includes an electrically insulating layer or substrate consisting of at least one of silica glass, diamond, or a nitride, oxide, fluoride or carbide compound.

18. The integrated circuit of claim 1, wherein the discontinuous die seal is formed as a maze-like die seal structures that allow only convoluted paths from outside the die seal to circuitry regions inside the die seal.

19. A method of producing an integrated circuit, including:
   forming a plurality of layers on a single electrically insulating substrate, the layers including a plurality of metal layers, a plurality of dielectric layers, and at least one semiconductor layer;
   patterning at least some of the layers to form at least two integrated circuit portions mutually spaced on the substrate and at least one coupling region to provide capacitive coupling between the otherwise mutually isolated integrated circuit portions;
   wherein at least one of the dielectric layers extends from the integrated circuit portions across the coupling region and at least a corresponding one of the metal layers and/or at least one semiconductor layer extends from each of the integrated circuit portions and partially across the coupling region to form capacitors therein and thereby provide the capacitive coupling between the integrated circuit portions;
   forming a discontinuous die seal around the integrated circuit portions, the discontinuous die seal being in the form of mutually spaced die seal portions separated by gaps disposed at locations corresponding to the at least one coupling region;

wherein the discontinuous die seal is configured to restrict or block lines of sight from outside the die seal to any of the integrated circuit portions or any of the at least one coupling region to inhibit crack propagation thereto from outside the die seal.

20. The integrated circuit of claim 19, wherein the discontinuous die seal is formed as a maze-like die seal structures that allow only convoluted paths from outside the die seal to circuitry regions inside the die seal.

* * * * *